(12) United States Patent
Bains (10) Patent No.: US 8,775,725 B2
(45) Date of Patent: Jul. 8, 2014

(54) MEMORY DEVICE REFRESH COMMANDS ON THE FLY

(75) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 304 days.

(21) Appl. No.: 12/977,974

(22) Filed: Dec. 23, 2010

(65) Prior Publication Data

US 2012/0144106 A1 Jun. 7, 2012

Related U.S. Application Data

(60) Provisional application No. 61/420,269, filed on Dec. 6, 2010.

(51) Int. Cl.
*G06F 13/00* (2006.01)
*G11C 11/406* (2006.01)

(52) U.S. Cl.
CPC ............................... *G11C 11/40615* (2013.01)
USPC ........................................ 711/106; 711/105

(58) Field of Classification Search
CPC ................................................ G11C 11/40615
USPC .................................................. 711/105, 106
See application file for complete search history.

(56) References Cited

U.S. PATENT DOCUMENTS

| | | | |
|---|---|---|---|
| 7,233,538 B1 | 6/2007 | Wu et al. | |
| 7,305,518 B2 | 12/2007 | Zeighami et al. | |
| 2004/0153603 A1* | 8/2004 | Janzen | 711/106 |
| 2005/0125597 A1* | 6/2005 | Lovett | 711/106 |
| 2006/0085616 A1* | 4/2006 | Zeighami et al. | 711/167 |
| 2008/0140923 A1* | 6/2008 | Bellows et al. | 711/106 |
| 2010/0142304 A1 | 6/2010 | Pyeon | |
| 2010/0208537 A1 | 8/2010 | Pelley et al. | |
| 2010/0252769 A1* | 10/2010 | Goepfert et al. | 251/324 |

OTHER PUBLICATIONS

International Search Report and Written Opinion from PCT/US2011/061853 mailed Jul. 10, 2012, 9 pages.

\* cited by examiner

*Primary Examiner* — Than Nguyen
(74) *Attorney, Agent, or Firm* — Blakely, Sokoloff, Taylor & Zafman LLP (57) ABSTRACT

On the fly switching from one memory device refresh rate to another is provided. Control logic associated with the memory device detects a condition to switch from a currently-applied refresh rate to a different refresh rate. In response to the condition, the refresh rate is dynamically switched. The switching does not require a change of a mode register. Thus, a refresh rate for the memory device can be dynamically changed on the fly.

22 Claims, 5 Drawing Sheets

MEMORY DEVICE REFRESH COMMANDS ON THE FLY

RELATED CASES

This application claims the benefit of priority of U.S. Provisional Patent Application No. 61/420,269, filed Dec. 6, 2010.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2010, Intel. Corporation, All Rights Reserved.

FIELD

Embodiments of the invention are generally related to memory devices, and more particularly to changing memory device refresh rate on the fly.

BACKGROUND

Memory devices find ubiquitous use in computing, devices. Dynamic random access memory (DRAM) is commonly used as working memory in computing devices. The working memory is often volatile (it loses state if power is interrupted to the system), and provides temporary storage for data and programs (code) to be accessed and executed by the system processor(s).

There are multiple types and variations of DRAM (one example being synchronous DRAM (SDRAM)). Being dynamic, DRAM requires continuous or regular refreshing of the data bits stored in the memory device. The refreshing is generally controlled by a memory controller, which periodically accesses the data bits in the memory device.

Each memory cell in a DRAM is typically constructed from a single transistor and a single capacitor and is called dynamic because its data decays and becomes invalid due to various leakage current paths to surrounding cells and to the substrate. Therefore, to keep the data in the cells valid, each memory cell is periodically refreshed. Data in the DRAM cell array is refreshed every time it is read out of the cell array into the sense amplifiers and subsequently rewritten into the cell. Memory that is not read is refreshed by a specific refresh operation.

The memory controller is responsible for periodically performing refresh maintenance operations on the memory cell array. Every row of the memory array needs to be refreshed before the data in the row decays to an invalid state. During self-refresh mode the DRAM device is responsible for performing the refreshes.

The refresh cycle time (tRFC) of DRAM continues to grow with DRAM densities and it starts impacting isochronous bandwidth and worst case latency numbers. Isochronous bandwidth refers to bandwidth guarantees on the memory subsystem.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

On the fly switching from one memory device refresh rate to another is provided. Different refresh rates can have different associated refresh cycle times (tRFC). Thus, on the fly switching allows the system to dynamically adjust refresh cycle time according to use of the device and the need to refresh memory elements. Additionally, on the fly switching allows the system to shorter alternatives to the standard growing tRFC of memory devices with increasing densities. Dynamic adjustment of the refresh rate allows the system to make performance decisions that lessen the impact on isochronous bandwidth and worse case latency.

Control logic associated with the memory device detects a condition to switch from a currently-applied refresh rate to a different refresh rate. In response to the condition, the refresh rate is dynamically switched. The switching does not require a change of a mode register. In one embodiment, each of the selected refresh rates is a separate refresh mode in the mode register. The mode register can have certain modes that allow dynamic switching between different rates (which could thus also be considered on the fly switching between different modes, but without changing the mode register). Thus, a refresh rate for the memory device can be dynamically changed on the fly.

An implementation of a memory subsystem typically includes memory resources that store the data, and an associated memory controller, which controls access to the memory resources. The memory controller may also manage refresh of the memory resources. In one embodiment, the memory device is a DRAM compatible with DDR (dual data rate) standards. Reference below is made to a DRAM as an example, which is to be understood as any memory device according to any embodiment described herein that supports switching among different refresh rates.

Certain memory implementations, such as those supporting DDR version 4 (DDR4), can perform a memory refresh at different speeds or rates, such as 1×, 2×, and 4×. Such varying memory refresh speeds can be selected by the use of a mode register. While varying refresh rates may be selectable, the selection was typically intended for initialization of the system, and expected to be constant throughout operation of the memory device. Thus, the refresh speed set by the refresh mode is traditionally considered fixed or constant. As described herein, memory refresh rates can be dynamically selected, or selected "on the fly".

For purposes of simplicity in description and clarity in term usage, reference is made herein to switching among different refresh 'rates', rather than switching among different refresh 'modes'. White it could be said that switching is done between different refresh modes, the use of refresh 'mode' may suggest switching refresh speed via the mode register. Rather, as described herein, dynamic, on the fly rate switching can be accomplished without changing the mode register settings. Thus, switching refresh 'rate' will be referred to for clarity that the mode register setting does not need to be changed to switch rates. It will be understood that different terminology could be used to describe dynamically switching among different refresh rates. Thus, to the extent refresh mode switching may be used to describe switching refresh rates without changing the mode register setting, such terminology may be comparable to what is described herein.

As referred to herein, "on the fly" selection refers to dynamic selection during active operation of the memory device. Thus, the device does not need to be in a suspended or inactive state to change the refresh rate of the device. Additionally, a mode register for the memory device does not need to be modified during system runtime for switching among different refresh rates. As used herein, "refresh rate" refers to a particular convention to be used for refreshing the memory device. Different rates refers to conventions that have differing refresh conventions, and specifically, to different average times between refreshes, and/or different durations of implementing a refresh command as discussed in more detail below. Again, per the discussion above, "refresh mode" could similarly be defined, but generally refers to the mode as set by a corresponding memory mode register.

Reference is made herein to various refresh timing parameters, which include tREF, tREFI, and tRFC. These parameters may be briefly described as follows:

tREF=Refresh period or refresh interval. To ensure data integrity in a DRAM's rows (e.g., 64K rows), a refresh command is executed for each row (e.g., 64K refresh commands) to every memory bank within tREF period. A typical value for devices as of the date of drafting is around 64 milliseconds.

tREFI=Average time between refresh commands. The implementation of tREFI may be modified (such as described herein), but mainstream DRAMs tend to have a standard tREFI of approximately 7.8 microseconds. Traditionally, tREFI could be computed as tREF divided by the number of rows to ensure refreshing all rows in during the refresh period. However, with increasing DRAM densities, more recent implementations include refreshing multiple rows per refresh command to accomplish the desired tREFI average time between refresh commands.

tRFC=Time to refresh when a refresh command is issued. It is also the time interval between REF (refresh) to a REF command to different rows of the same bank, and is typically on the order of 100 or 200 nanoseconds. tRFC is smaller than tRC (time to read command) as column access gates are not turned on. At the end of tRFC, either a REF or ACT (activate) command can be given to the bank just refreshed. As DRAM densities increase over time (256 Mbit to 512 Mbit to 1 Gbit . . . ), the trend is to have more rows of memory, which in turn will increase the refresh overhead including tRFC.

In one embodiment, a refresh interval (tREFI) is associated with a corresponding refresh cycle time (tRFC). Thus, a refresh rate may be associated with a refresh cycle time. A shorter tREFI (i.e., more frequent refreshes) is generally associated with a shorter tRFC. However, a 2× value on tREFI does not necessarily cut down the tRFC in half due to the fixed overhead of staggering associated with tRFC. If a shorter tREFI is used then the overall time spent in refreshing is longer and there is also impact on command bandwidth. The command bandwidth refers to bandwidth over controls channels to manage the memory access.

As described herein, the memory can issue a refresh on the fly. The memory controller has the option to specify the refresh type as part of the command encoding. Thus, the memory controller can implement, for example, 2× or 4× values on tREFI when there is heavier traffic on memory access or access is made by an entity with higher sensitivity to memory access bandwidth, and reduce the tREFI value when traffic is lighter or when latency is not as significant a consideration.

The control of the dynamic switching of refresh rates is based on some sort of trigger. In one embodiment, the trigger is based on timing, such as switching on a schedule, or not allowing use of an accelerated refresh rate for more than a period of time or more than a number of instructions. In one embodiment, the trigger is based on traffic at the memory device, such as heavy access traffic (which can be responded to with an accelerated refresh rate to reduce the overhead of refresh during heavy access), or light access traffic (which could trigger a slower refresh rate to guarantee meeting refresh minimums. Thus, a lower and/or a higher threshold of traffic may be set to trigger refresh rate switching. The threshold could be a depth of a request buffer, a number of requests per time period, or a period of delay expected between the issuance of a command and its completion (e.g., taking into account how long it might sit in a buffer).

In one embodiment, a memory controller may issue a series of refresh commands to perform refresh clean-up or catch-up. For example, as discussed above, accelerated refresh is not anticipated to be able to refresh all memory resources of a memory device in the same number of cycles as it could be accomplished at a non-accelerate refresh rate. Thus, use of an accelerated or fast refresh rate instead of the standard or default rate is that certain memory elements may be approaching a critical time for updating to avoid losing data. The series of refresh commands can allow the memory device to be updated. The series of commands can be understood as being a series of commands for refresh without access requests.

In one embodiment, a series of "catch-up" commands are always refresh commands according to the slowest possible refresh cycle time (e.g., a 1× refresh rate). The use of the default or standard refresh rate allows more refreshing to be accomplished per command. Thus, the refresh catch-up could be accomplished at the accelerated rate, but with more overhead as more commands would be required. The issuing of commands, for example, at the 1× refresh rate has less of a command overhead versus 2× or 4×, because only one command is needed as opposed to two or four, respectively. Switching refresh modes allows the same work to be accomplished more efficiently in the system.

Figure 1:
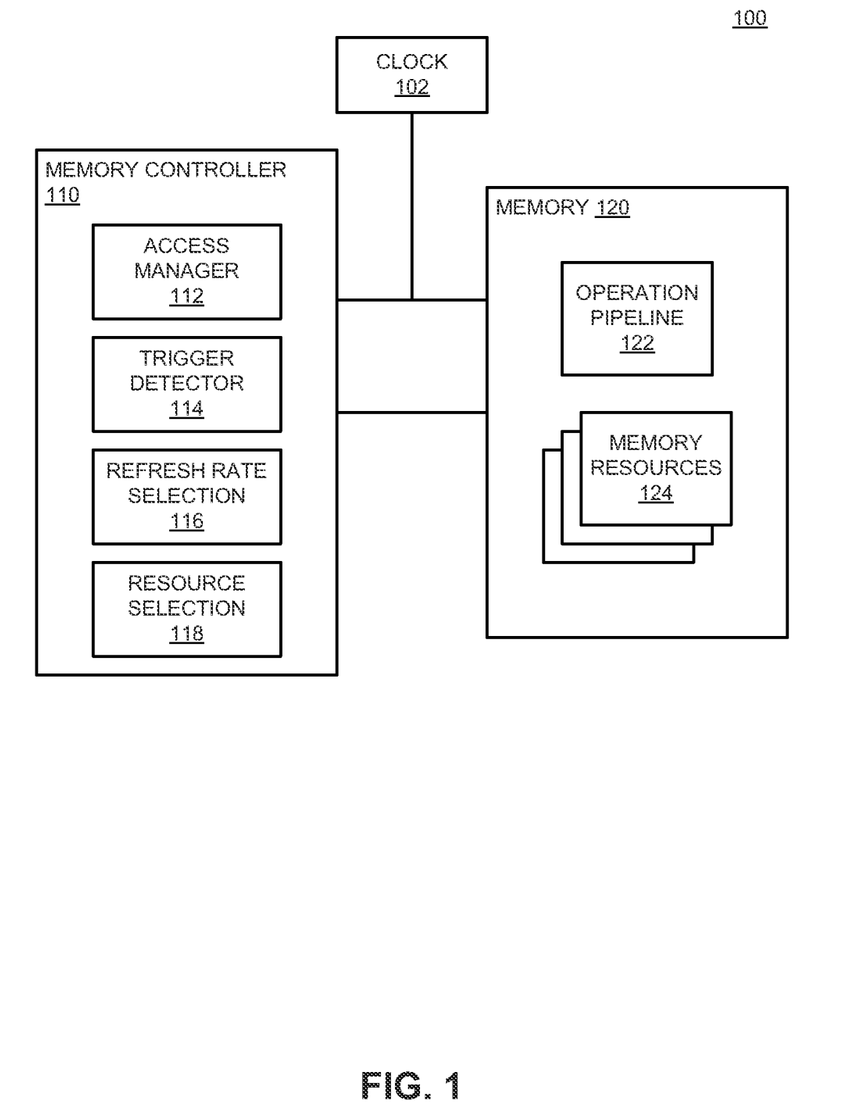
FIG. 1 is a block diagram of an embodiment of a system with a memory device that has dynamic switching of refresh rate based on controls from a memory controller.

FIG. 1 is a block diagram of an embodiment of a system with a memory device that has dynamic switching of refresh rate based on controls from a memory controller. System 100 represents any of a number of computing devices that may include a memory device with dynamic refresh rate switching. Such computing devices may include servers, desktops, laptops, mobile devices, smartphones, gaming devices, and others. System 100 includes memory 120, which is a memory device according to any embodiment described herein and includes one or more memory resources 124, which represent the resources on which the data is stored for memory 120.

Memory controller 110 includes standard logic (hardware and/or software) to control access to memory 120 as is understood in the art. Memory controller 110 is associated with memory 120 because it controls access to memory 120. In one embodiment, memory controller 110 includes functionality (e.g., features implemented by logic of memory controller 110) access manager 112, trigger detector 114, refresh rate selection 116, and resource selection 118. The illustrated functionality is not intended to represent all functionality of memory controller 110. Memory controller 110 could be implemented with more or fewer functional components than shown.

Access manager 112 enables memory controller 110 to determine how heavy access traffic is to memory 120. Thus, access manager 112 enables memory controller to monitor, track, and possibly store information related to the number of access to different memory devices in system 100. Access manager 112 can identify traffic to memory 120.

Trigger detector 114 enables memory controller 110 to determine conditions under which refresh rate ought to be switched. As mentioned above, the trigger could be based on timing, or traffic. A traffic threshold can indicate when refresh rate can or ought to be switched. Trigger detector 114 may work in conjunction with access manager 112. For example, it may be through access manager 112 that memory controller 110 knows what access traffic exists for memory 120, and then through trigger 114 determine whether or not that amount of traffic indicates conditions for a change in refresh rate.

Refresh rate selection 116 enables memory controller 110 to implement and property apply various different refresh rates. In one embodiment, memory controller 110 may include logic to implement multiple different refresh rates associated with different refresh modes. The different refresh rates have accompanying conventions such as when to send commands, how many nops to issue between commands, how long a memory resource will be occupied executing the command, how many commands can or must be issued for the particular rate, or other conventions.

In one embodiment, different refresh rates are used to apply to different memory resources 124. Thus, resource selection 118 enables memory controller 110 to properly apply a selected refresh rate to a specific memory resource. In one embodiment, application of different rates to different resources is managed with a data structure or table or other such mechanism. Alternatively, different registers could apply to different resources for managing the different refresh rates of the different resources.

Clock 102 represents a clock signal to apply to memory 120 and memory controller 110 for memory access commands. Clock 102 may be a main system clock a clock used to control a processor), a peripheral clock, or some modified (e.g., scaled down) version of some such clock. It is also possible to implement a clock device specifically for memory access. Issued commands and state changes in memory 120 typically occur in reference to clock 102. Refresh rate is made specifically with respect to clock 102—an accelerated refresh cycle will conclude in fewer clock cycles than a standard refresh cycle.

Memory 120 includes operation pipeline 122, which represents a pipeline of commands from memory controller 110. Access commands and refresh commands may be placed in operation pipeline 122 for execution by memory 120. In one embodiment, a refresh catch-up operation includes filling operation pipeline 122 with refresh commands. By filling the pipeline with refresh commands, memory controller 110 may effectively prevent other memory access operations or refresh rates switches until the catch-up is concluded. Memory controller 110 may instead actively prevent access operations or refresh rate switching by simply not permitting such commands until refresh catch up is concluded.

Figure 2:
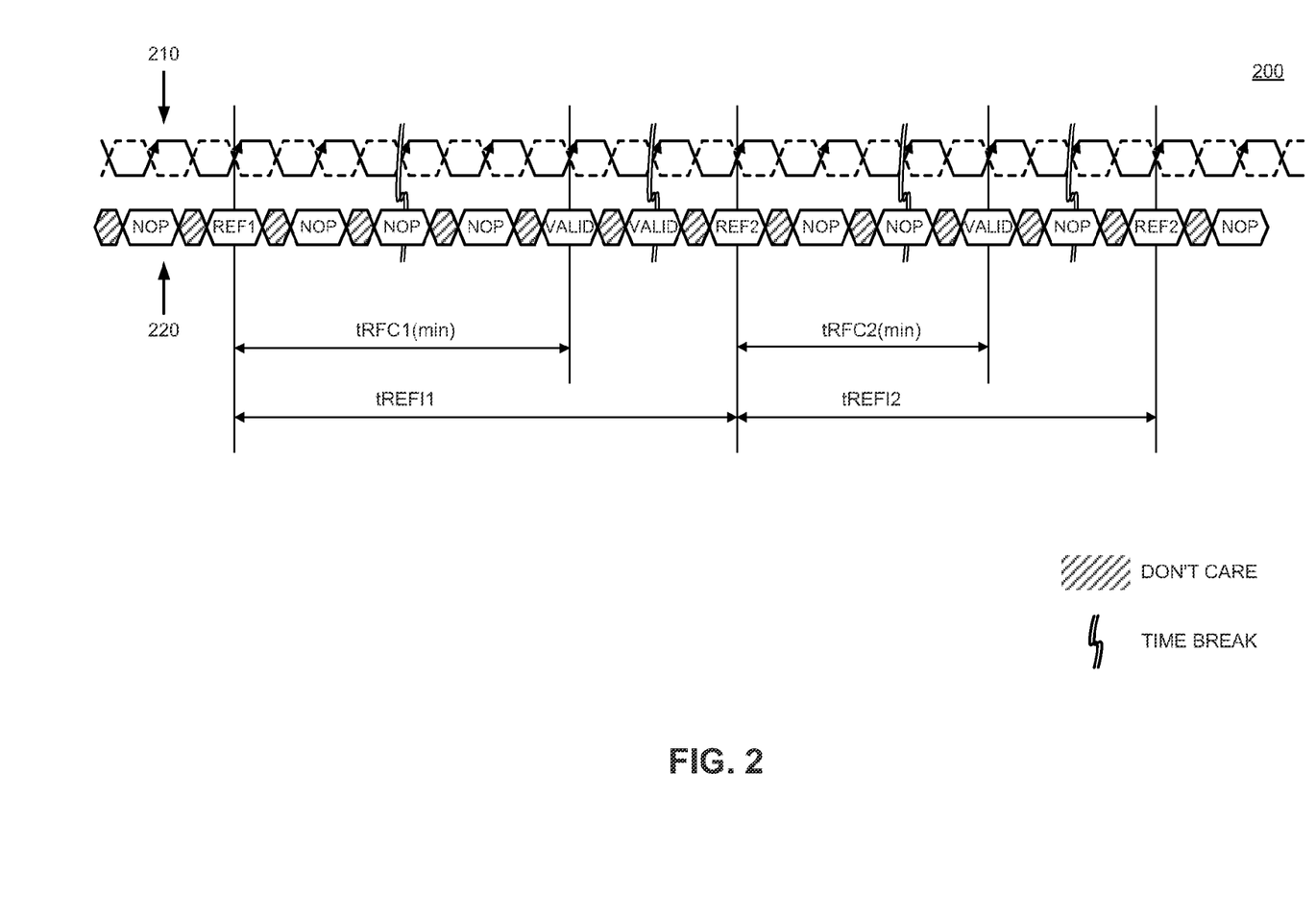
FIG. 2 is a timing diagram of an embodiment of a system with on the fly refresh rate switching.

FIG. 2 is a timing diagram of an embodiment of a system with on the fly refresh mode switching. Timing diagram 200 illustrates one example implementation. Timing diagram 200 illustrates relative timing for a memory device that uses variable refresh rates. The memory device receives refresh commands over a command line from an associated memory controller. In one embodiment, the memory device is a DRAM compatible with DDR (dual data rate) standards, such as DDR4. An associated memory controller or a corresponding memory controller with respect to a memory device is a memory controller that controls access to the memory device.

Timing diagram 200 includes an illustration of clock signal 210 and command signal 220. In the command signals, commands may be interspersed with "Don't Care" signals, meaning it is not important what the state of the signal line is during that time, because a trigger indicating a command (e.g., setting an enable line) has not been given.

In accordance with timing diagram 200, when the memory controller uses a 1× REF command (REF1 in command signal 220), the refresh cycle time of tRFC1 is used with a refresh interval of tREFI1. When the memory controller issues a 2× REF command (REF2 in command signal 220), the refresh cycle time of tRFC2 is used with a refresh interval of tREFI2. With the time breaks, timing diagram 200 does not provide an exact illustration of the comparison between tREFI1 and tREFI2, but tREFI2 is shorter than tREFI1 by about half.

In one embodiment, the memory controller issues a second 2×REF command (the second REF2 after completion of tREFI2) right after the first 2× REF command. There are different possible options to control how often the memory controller can switch between standard (e.g., 1×) and accelerated (e.g., 2× or 4×) refresh rates. Timing diagram illustrates an option where the memory controller is constrained to issue two or multiples of two commands when using a 2× rate, before switching back to the 1× rate. In general, there may be a constraint to issue N or multiples of N commands at Nx rate before switching to a different rate, where N is an integer (i.e., 1 command for 1× rate, 2 commands for 2× rate, 4 commands for 4× rate, and so forth).

An option with more flexibility is for the memory controller to switch as desired. For example, the memory controller can issue a single command with a 2× refresh rate and then issue a command with 1× rate. For such an implementation, the memory controller would need to guarantee that all refreshes would be issued within tREF to refresh all necessary memory elements. If there are no restrictions (such as issuing N or multiples of N commands before switching) on changing refresh rates, the memory device design can also increase in complexity. For example, the memory device may require row address counters with more bits and additional logic for control.

Thus, there may be a tradeoff of logic in the memory controller (e.g., to monitor and guarantee the issuing of all refreshes) versus flexibility for the memory controller to switch among refresh rates. While most examples herein make reference to two refresh rates, the logic would need to be more sophisticated for implementations where more (for example, three) different refresh rates are available. In one embodiment, the memory controller includes a functional element to calculate and monitor the refresh requirements versus the refreshing being done with commands at varying refresh rates.

In one embodiment, the memory controller uses either a 2× or 4× refresh rate when there are a lot of requests in the pipeline. If the refreshes reach a critical threshold the memory controller can switch to 1× rate and issue a series of refreshes to catch up. In one embodiment, DRAM specifications allow queuing of up to 9 refreshes.

Figure 3:
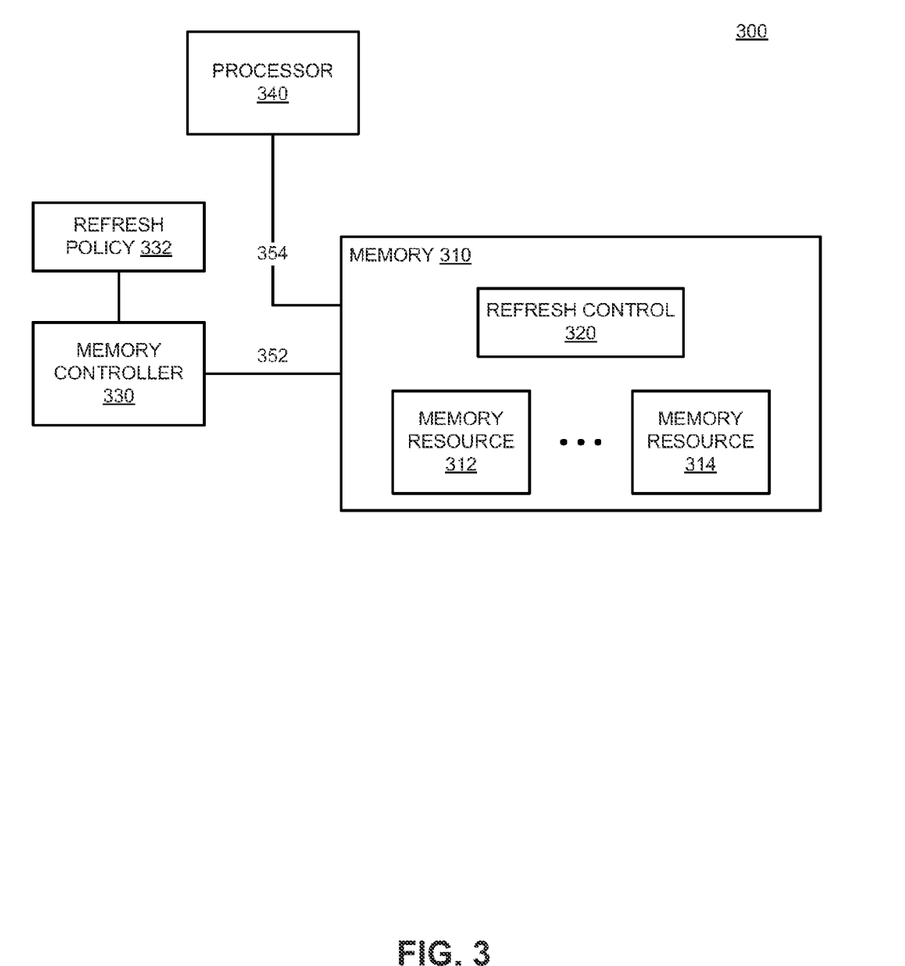
FIG. 3 is a block diagram of an embodiment of a system having a memory device with on the fly refresh rate control.

FIG. 3 is a block diagram of an embodiment of a system having a memory device with on the fly refresh mode control. Any of a variety of computing devices may include a memory device with on the fly dynamic refresh rate switching as described herein. System 300 represents any of a number of computing devices that may include dynamic switching of refresh rates. Such computing devices may include servers, desktops, laptops, mobile devices, smartphones, gaming devices, and other devices that have memory that needs to be periodically refreshed.

System 300 includes memory 310, which is a memory device according to any embodiment described herein and includes one or more memory: resources 312-314. Memory resources 312-314 represent the resources on which the data is stored for memory 310. In one embodiment, the memory resources are separate memory channels, memory banks, memory groups, or other similar separation. The logic required to implement any separate beyond that of memory channels may prevent any separation greater than separate channels in many practical implementations.

Memory 310 further includes refresh control 320, which represents hardware and/or software logic within memory 310 to implement refresh operations in response to commands from memory controller 330. In one embodiment, refresh control 320 includes a pipeline of commands received from the memory controller. In one embodiment, memory 310 only receives and executes a single command before responding back to memory controller 330; thus, in such an implementation a pipeline of commands may be implemented at memory controller 330.

Memory controller 330 includes standard logic (hardware and/or software) to control access to memory 310 as is understood in the art. Additionally, memory controller 330 includes logic to read and react to refresh rate change triggers generated in system 300, as discussed above. Thus, the memory controller includes logic to dynamically switch among different refresh modes of differing refresh rates. Memory controller 330 is associated with memory 310 because it controls the access of memory 310. Memory controller 330 is shown connected to memory 310 via channel 352, which could be a single line channel, or a multi-line channel a bus), or a combination.

In one embodiment, memory controller 330 accesses refresh policy 332 associated with memory 310. In one embodiment, memory controller 330 has multiple different policies depending on the number of memory banks in system 300. Experimentation has shown that burst on the fly shows better performance with a single bank of memory populated. With multiple banks, memory controller 330 has more opportunities to refresh the bank that is not being accessed.

In one embodiment, DRAM can have an option to refresh per bank group or refresh all bank groups. In such an implementation memory controller 330 can issue a refresh command on the fly to select between per bank group refresh and refresh-all. The techniques described for switching between standard and accelerated refresh rates also apply to such an implementation.

Processor 340 represents processing resources of system 300. While shown in the singular, it will be understood that processor 340 may include one or more processor devices, such as or including multi-core devices. Processor 340 accesses memory 310 over bus 354 to perform read and write operations. In one embodiment, bus 354 may be physically routed through memory controller 330, but is shown logically separate to represent the fact that access to memory 310 from processor 340 may not include certain functions present in memory controller 330 (such as refresh rate changing).

Figure 4:
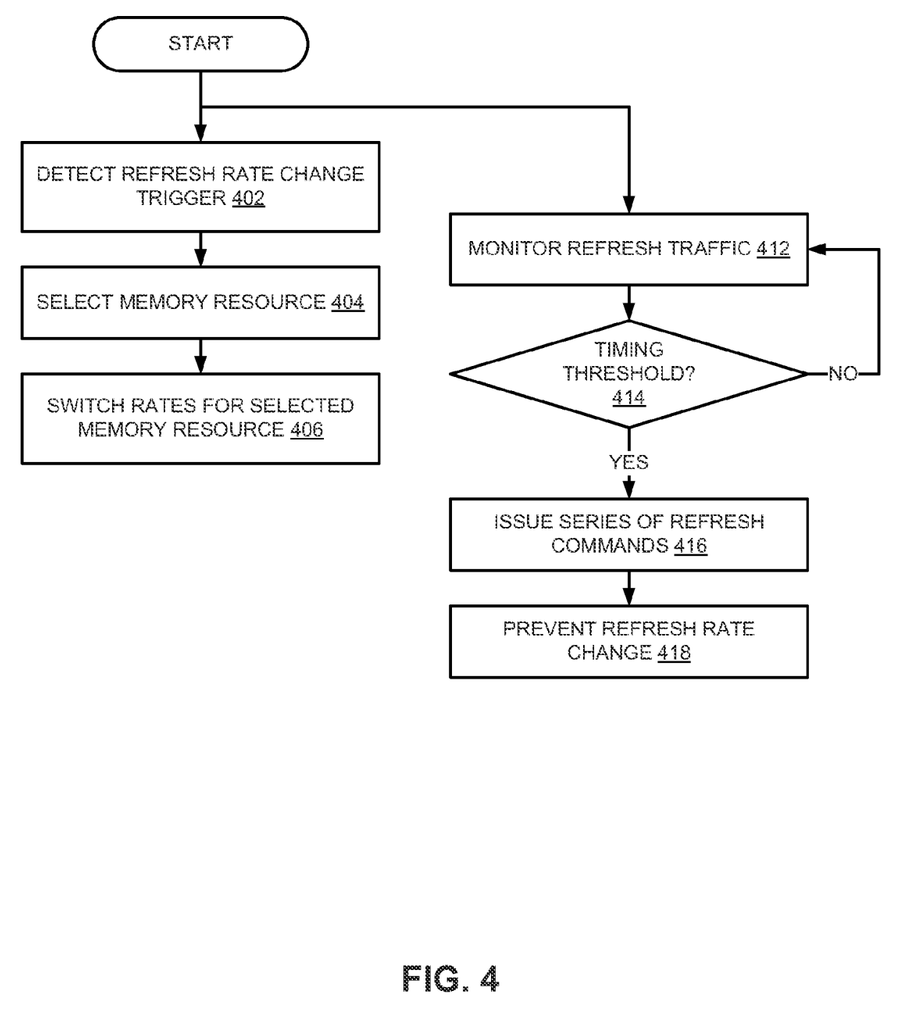
FIG. 4 is a flow diagram of an embodiment of a process for dynamically switching refresh rate for a memory device, and issuing catch-up refresh commands.

FIG. 4 is a flow diagram of an embodiment of a process for dynamically switching refresh mode for a memory device, and issuing catch-up refresh commands. Flow diagrams as illustrated herein provide examples of sequences of various process actions. Although shown in a particular sequence or order, unless otherwise specified, the order of the actions can be modified. Thus, the illustrated implementations should be understood only as an example, and the process can be performed in a different order, and some actions may be performed in parallel. Additionally, one or more actions can be omitted in various embodiments of the invention; thus, not all actions are required in every implementation. Other process flows are possible.

A memory controller or memory resource control logic detects a refresh rate change trigger, 402. For example, the controller may detect traffic higher than a threshold, which triggers the controller to use faster refreshes, or detect a lower traffic threshold, which allows the controller to use a slower refresh rate. In one embodiment, the type of data request (e.g., the type of data requested) could trigger a refresh rate change. For example, a request for data of a type that has a guaranteed bandwidth may trigger use of a higher refresh rate.

In one embodiment, different refresh rates apply to different memory resources. The controller may select the memory resource, 404, to which to apply a refresh rate change. In another embodiment, for example based on memory structure or configuration, refresh rates apply the same to all memory resources, obviating selection of a resource. The controller switches the refresh rate for the selected memory resource, 406. Refresh commands are then issued to the selected memory resource until another refresh rate is chosen.

In one embodiment, the system monitors refresh traffic, 412, to determine whether all refreshes will be completed within a time necessary to guarantee validity of the data stored on the memory resources. It is typically the controller that would monitor the refresh traffic. If a timing threshold for completing all refreshes is not reached, 414, the system continues to monitor refresh traffic, 412.

If a timing threshold for completing the refreshes is reach, 414, the controller issues a series of refresh commands to catch up, 416. The controller issues the commands within a time necessary to guarantee validity of the data, but may issue them without much time to spare. Thus, a series of commands may be necessary to temporarily occupy the memory resources with refresh operations. While it may affect memory access performance, it is necessary to guarantee data validity. The controller may prevent refresh rate changes during the refresh catch up, 418. As mentioned above, preventing refresh rate changes could be accomplished directly by not issuing commands, and/or could be performed more passively by loading the memory pipeline with commands.

Figure 5:
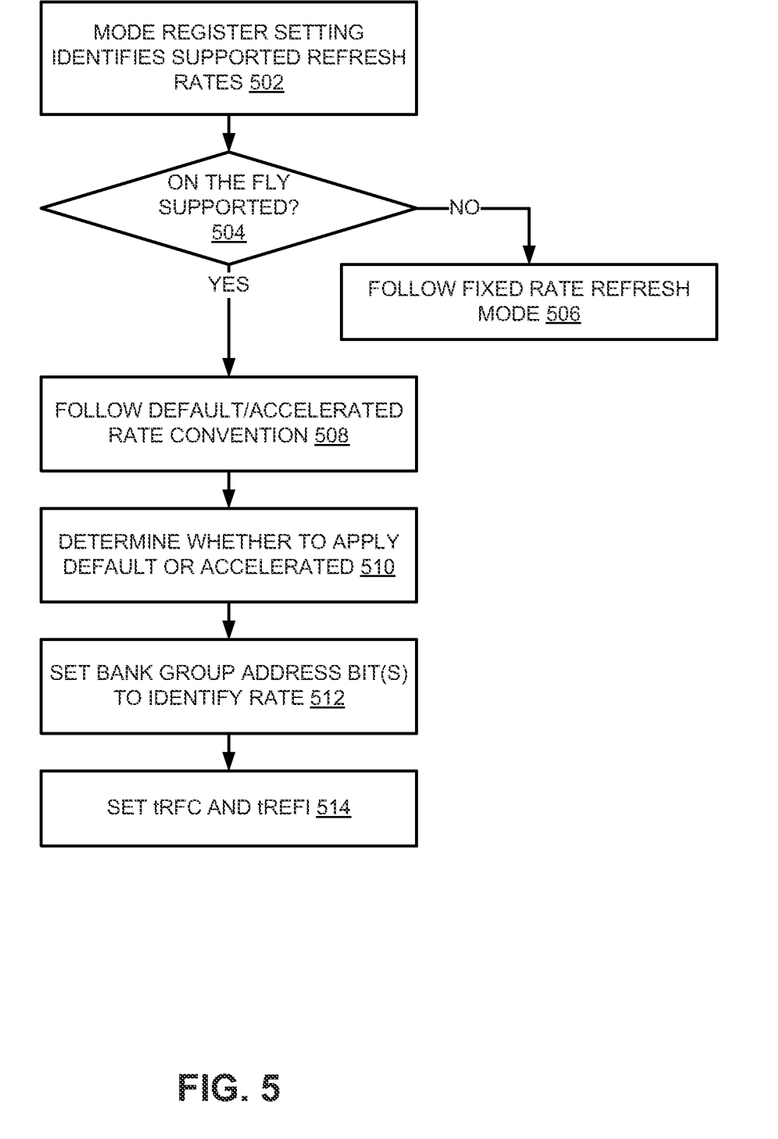
FIG. 5 is a flow diagram of an embodiment of a process for switching refresh rates with bank group address bits.

FIG. 5 is a flow diagram of an embodiment of a process for switching refresh modes with bank group address bits. In one embodiment, a mode register is used to set and determine what refresh rates are supported for a memory resource, 502. The mode register can be set by the system BIOS (basic input/output system, typically for system initialization) or a controller. Some of the modes may be fixed modes, which require a setting in the mode register to be changed to change refresh rate (e.g., whatever refresh mode is selected must be changed in the mode register to another refresh mode to get a corresponding different refresh rate).

If on the fly refresh rate changing is not supported by the refresh mode, 504, the controller follows the fixed rate refresh mode, 506, and cannot issue refresh rate changes dynamically during operation of the memory device. If on the fly refresh rate changing is supported by the refresh mode, 504, the controller follows a default/accelerated rate convention, 508. The default refresh rate is a rate that will be a standard rate for the memory resources. As described herein, such a rate can be referred to as 1×. The accelerated rate or rates are factors of the standard rate, and may differ for different implementations.

In one embodiment, the controller determines whether to apply the default or the accelerated rate, 510. Such a determination may be made based on a policy for a particular memory resource (such as based on traffic and/or validity guarantees). In one embodiment, the controller sets one or more bank group address bits to identify the selected refresh rate, 512. The controller sets a tRFC and tREFI in accordance with the selected refresh rate, 514.

In one embodiment, the refresh described herein is applied in a DDR4 implementation. The following provides one example of a mode register setting defined for DDR4.

| Ax | Ay | Az | Refresh Rate Mode |
|----|----|----|-------------------|
| 0 | 0 | 0 | Normal Mode (Fixed 1x) |
| 0 | 0 | 1 | Fixed 2x |
| 0 | 1 | 0 | Fixed 4x |
| 0 | 1 | 1 | Reserved |
| 1 | 0 | 0 | Reserved |
| 1 | 0 | 1 | On the Fly 1x/2x |
| 1 | 1 | 0 | On the Fly 1x/4x |
| 1 | 1 | 1 | Reserved |

An on the fly mode can be enabled through available options in a corresponding mode register. Control bits in the register can be used to control the refresh mode of the associated memory resource. Control bit Ax can indicate to the system to use on the fly instead of fixed refresh modes. One or more of the other control bits can then be used to determine what values of tREFI are available. It will be understood that more bits could be used to enable more refresh modes than what is illustrated. In one embodiment, the number of modes may be restricted to reduce the complexity of memory testing and validation. As one example, the above table illustrates an on the fly option to switch between 1× and 2× and another option to switch between 1× and 4×. Other options (such as switching between any of 1×, 2×, and 4×) could also be used in other implementations. For example, any combination of different refresh cycle times of 1×, 2×, and 4× can be issued where 1× is a standard time, 2× is the standard time divided by 2, and 4× is the standard time divided by 4. Thus, the example of the table is not limiting.

The normal mode (fixed 1×) is the legacy mode (e.g., 7.8 microsecond average refresh interval). Fixed 2× and 4× rates may also be supported. In 2× refresh mode the refreshes are issued twice as fast (e.g., at 3.9 microseconds (7.8 usec/2)) an average refresh interval. In one embodiment, in 2× refresh mode the DRAM internally will only refresh half the number of rows that it would have refreshed with 1× refresh mode. In 4× refresh mode refreshes are issued four times as fast (e.g., at 1.95 microseconds (7.8 usec/4)) an average refresh interval. The implementation of 1×, 2×, or 4× fixed refresh mode is controlled by bits Ay and Az, which represent two bits in a mode register (e.g., a register stored at the DRAM and/or at the memory controller).

The switching is controlled by the memory controller, and can be changed, for example, based on the traffic seen by the controller. In one embodiment, the refresh command is a specific command encoding issued by the memory controller. One example of a command table to issue refresh commands is as follows:

| FUNCTION | CS# | ACT# | RAS#/ A15 | CAS#/ A14 | WE#/ A13 | BG1 | BG0 | BA 0-1 | A10/ AP | A0-9, A11-12 A16-20 | NOTE |
|----------|-----|------|-----------|-----------|----------|-----|-----|--------|---------|---------------------|------|
| Refresh (Fixed Rate) | L | H | L | L | H | V | V | V | V | V | Ax = '0' |
| Refresh (OTF 1x) | L | H | L | L | H | V | L | V | V | V | Ax = '1' |
| Refresh (OTF 2x) | L | H | L | L | H | V | H | V | V | V | AxAyAz = '101' |
| Refresh (OTF 4x) | | | | | | | | | | | AxAyAz = '110' |

As illustrated, in one embodiment, a specific pin (BG0 or bank group 0) can be used to specify the type of encoding (e.g., for BG0=0, use 1×, and for BG0=1, use either 2× or 4× depending on the implementation selected). If a refresh "on the fly 1×/2×" option is selected using the mode register, then bank group address bit BG0 is used to distinguish between 1× and 2× commands. Thus, reference to a mode register can indicate what refresh modes are available, and other control bits may indicate what refresh rate (or what dynamic refresh mode) is selected.

In one embodiment, if BG0=L, the DRAM executes refresh using a tRFC of 1×, and if BG0=H, the DRAM executes refresh using a corresponding tRFC value associated with 2× refresh. If a refresh "on the fly 1×/4×" option was instead selected, BG0=H could cause the DRAM to execute refresh using a corresponding tRFC value associated with 4× refresh. Alternation between high (H) and low (L) logic levels could also be done.

Various operations or functions are described herein, which may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communications interface to send data via the communications interface. A machine readable medium or computer readable medium may cause a machine to perform the functions or operations described, and includes any mechanism that provides (i.e., stores and/or transmits) information in a form accessible by a machine (e.g., computing device, electronic system, or other device), such as via recordable/non-recordable storage media (e.g., read only memory (ROM), random access memory (RAM), magnetic disk storage media, optical storage media, flash memory devices, or other storage media) or via transmission media (e.g., optical, digital, electrical, acoustic signals or other propagated signal). A communication interface includes any mechanism that interfaces to any of a hardwired, wireless, optical, or other medium to communicate to another device, such as a memory bus interface, a processor bus interface, an Internet connection, a disk controller. The communication interface can be configured by providing configuration parameters and/or sending signals to prepare the communication interface to provide a data signal describing the software content.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
detecting a refresh rate trigger; and
dynamically switching in a memory device during active operation of the memory device from one refresh rate to another in response to detecting the refresh rate trigger, where each respective refresh rate indicates a rate at which the memory device is to internally refresh dynamic storage elements included within the memory device, including indicating how much time the memory device spends refreshing the dynamic storage elements in response to each individual refresh command issued by the memory controller; and
where the one and the other refresh rates are different to provide different internal timing control for refresh operations of the memory device.

2. The method of claim 1, wherein detecting the trigger comprises:
detecting a threshold amount of traffic to the memory device.

3. The method of claim 1, wherein each refresh rate includes a different refresh cycle time or approximate period between refresh commands.

4. The method of claim 1, wherein the different refresh rates include a 1× rate, a 2× rate, and a 4× rate, where 1× rate has a standard cycle time, 2× rate has a cycle time of the standard cycle time divided by 2, and 4× rate has a cycle time of the standard time divided by 4.

5. The method of claim 1, wherein dynamically switching further comprises:
setting an active refresh rate for the memory device with command bits not associated with a mode register associated with the memory device.

6. The method of claim 1, further comprising:
issuing a series of refresh commands to perform a refresh catch-up for the memory device.

7. The method of claim 6, wherein issuing the series of refresh commands comprises:
issuing a series of refresh commands having a slowest available cycle time of a set of selectable cycle times.

8. The method of claim 1, wherein each refresh rate indicates an average time between refresh commands for different storage elements within the memory device.

9. An apparatus comprising:
memory resources to store data; and
memory resource control logic coupled to the memory resources, the control logic to
detect a refresh rate trigger; and
dynamically switch, during active operation of the memory resources, from one refresh rate to another in response to detecting the refresh rate trigger, where each respective refresh rate indicates a rate at which the memory device is to internally refresh dynamic storage elements included within the memory device, including indicating how much time the memory device spends refreshing the dynamic storage elements in response to each individual refresh command issued by the memory controller, where the one and the other refresh rates are different to provide different internal timing control for refresh operations of the memory device.

10. The apparatus of claim 9, wherein the memory resource control logic is to detect a threshold amount of traffic to the memory device, where the threshold amount acts as a refresh rate trigger.

11. The apparatus of claim 9, wherein each refresh rate includes a different refresh cycle time or approximate period between refresh commands.

12. The apparatus of claim 9, wherein the different refresh rates include a 1× rate, a 2× rate, and a 4× rate, where 1× rate has a standard cycle time, 2× rate has a cycle time of the standard cycle time divided by 2, and 4× rate has a cycle time of the standard time divided by 4.

13. The apparatus of claim 9, wherein the memory resource control logic is to dynamically switch refresh rates by
setting an active refresh rate for the memory device with command bits not associated with a mode register associated with the memory device.

14. The apparatus of claim 9, wherein the memory resource control logic is to further
issue a series of refresh commands to perform a refresh catch-up for the memory device.

15. The apparatus of claim 14, wherein the memory resource control logic is to issue a series of refresh commands having a slowest available cycle time of a set of selectable cycle times.

16. A system comprising:
a memory device having
memory resources to store data; and
memory resource control logic coupled to the memory resources, the control logic to detect a refresh rate trigger; and dynamically switch, during active operation of the memory resources, from one refresh rate to another in response to detecting the refresh rate trigger, where each respective refresh rate indicates a rate at which the memory device is to internally refresh dynamic storage elements included within the memory device, including indicating how much time the memory device spends refreshing the dynamic storage elements in response to each individual refresh command issued by the memory controller, where the one and the other refresh rates are different to provide different internal timing control for refresh operations of the memory device, and where the refresh rate trigger is related to access request traffic to the memory resources; and a multi-core processor coupled to the memory device to generate memory access requests for data stored on the memory device.

17. The system of claim 16, wherein the memory resource control logic is to detect a threshold amount of traffic to the memory device, where the threshold amount acts as a refresh rate trigger.

18. The system of claim 16, wherein each refresh rate includes a different refresh cycle time or approximate period between refresh commands.

19. The system of claim 16, wherein the different refresh rates include a 1× rate, a 2× rate, and a 4× rate, where 1× rate has a standard cycle time, 2× rate has a cycle time of the standard cycle time divided by 2, and 4× rate has a cycle time of the standard time divided by 4.

20. The system of claim 16, wherein the memory resource control logic is to dynamically switch refresh rates by
   setting an active refresh rate for the memory device with command bits not associated with a mode register associated with the memory device.

21. The system of claim 16, wherein the memory resource control logic is to further
   issue a series of refresh commands to perform a refresh catch-up for the memory device.

22. The system of claim 21, wherein the memory resource control logic is to issue a series of refresh commands having a slowest available cycle time of a set of selectable cycle times.

* * * * *